(12) United States Patent
Wagner et al.

(10) Patent No.: US 7,968,146 B2
(45) Date of Patent: Jun. 28, 2011

(54) HYBRID LAYERS FOR USE IN COATINGS ON ELECTRONIC DEVICES OR OTHER ARTICLES

(75) Inventors: Sigurd Wagner, Princeton, NJ (US); Prashant Mandlik, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 297 days.

(21) Appl. No.: 11/931,939

(22) Filed: Oct. 31, 2007

(65) Prior Publication Data

US 2008/0237181 A1 Oct. 2, 2008

Related U.S. Application Data

(63) Continuation-in-part of application No. 11/783,361, filed on Apr. 9, 2007.

(60) Provisional application No. 60/856,047, filed on Nov. 1, 2006.

(51) Int. Cl.
*C23C 16/448* (2006.01)
(52) U.S. Cl. ...................... 427/248.1; 427/569; 428/336
(58) Field of Classification Search .................. None
See application file for complete search history.

(56) References Cited

U.S. PATENT DOCUMENTS

| 5,296,745 | A | | 3/1994 | Shirai et al. |
| 5,298,290 | A | * | 3/1994 | Jost et al. ...................... 427/489 |
| 6,139,699 | A | | 10/2000 | Chiang et al. |
| 6,369,316 | B1 | | 4/2002 | Plessing et al. |
| 6,597,111 | B2 | | 7/2003 | Silvernail et al. |
| 6,866,901 | B2 | | 3/2005 | Burrows et al. |
| 7,002,294 | B2 | | 2/2006 | Forrest et al. |
| 7,187,119 | B2 | | 3/2007 | Weaver et al. |
| 7,301,280 | B2 | * | 11/2007 | Su et al. ......................... 313/512 |
| 2002/0125822 | A1 | * | 9/2002 | Graff et al. ..................... 313/506 |
| 2003/0117068 | A1 | * | 6/2003 | Forrest et al. ................. 313/504 |
| 2004/0033373 | A1 | | 2/2004 | Rose et al. |

(Continued)

FOREIGN PATENT DOCUMENTS

WO WO 2005/051525 6/2005

(Continued)

OTHER PUBLICATIONS

Manlik, et al. Applied Physics Letters, 92, 103309 (2008).*

(Continued)

*Primary Examiner* — Timothy H Meeks
*Assistant Examiner* — Joseph Miller, Jr.
(74) *Attorney, Agent, or Firm* — Kenyon & Kenyon LLP

(57) ABSTRACT

A method for forming a coating over a surface is disclosed. The method comprises depositing over a surface, a hybrid layer comprising a mixture of a polymeric material and a non-polymeric material. The hybrid layer may have a single phase or comprise multiple phases. The hybrid layer is formed by chemical vapor deposition using a single source of precursor material. The chemical vapor deposition process may be plasma-enhanced and may be performed using a reactant gas. The precursor material may be an organo-silicon compound, such as a siloxane. The hybrid layer may comprise various types of polymeric materials, such as silicone polymers, and various types of non-polymeric materials, such as silicon oxides. By varying the reaction conditions, the wt % ratio of polymeric material to non-polymeric material may be adjusted. The hybrid layer may have various characteristics suitable for use with organic light-emitting devices, such as optical transparency, impermeability, and/or flexibility.

43 Claims, 13 Drawing Sheets

U.S. PATENT DOCUMENTS

2004/0135268 A1* 7/2004 Frischknecht ............... 257/788
2004/0195960 A1* 10/2004 Czeremuszkin et al. ..... 313/504
2007/0210459 A1 9/2007 Burrows et al.

FOREIGN PATENT DOCUMENTS

WO  WO 2005/051525  * 9/2005

OTHER PUBLICATIONS

Mandlik, Applied Physics Letters, V93, 2008, p203306. Previously supplied by applicants but not provided on IDS. Better copy of NPL provided.*

International Search Report and Written Opinion from PCT/US2007/023098, mailed on Mar. 10, 2008.

Chung et al., 1994, "An Adhesion Study of Copper and Chromium Films to Polyimide", Materials Research Society Symposium Proceedings, vol. 323, pp. 377-382.

Yoshinari et al., 2006, "Oxygen plasma surface modification enhances immobilization of simvastatin", Biomedical Research, 27(1): 29-36.

Borer et al., 2006, "Influence of substrate temperature on morpology of $SiO_x$ films deposited on particles by PECVD", Surface and Coatings Technology 201:1757-1762.

Bertrand et al., 1998, "Adhesion improvement of plasma-deposited silica thin films on stainless steel substrate studied by x-ray photoemission spectroscopy and in situ infrared ellipsometry", J. Vac. Sci. Technol. 16(1):6-12.

Chen et al., 2006, "Effects of plasma pretreatment on silicon nitride barrier films on polycarbonate substrates", Thin Solid Films 514:188-192.

Wuu et al., "Transparent Barrier Coatings for Flexible Organic Light Emitting Diode Applications", Chem. Vap. Deposition, 2006, 12:220-224.

Erlat et al., "Morphology and gas barrier properties of thin SiOx Coatings on polycarbonate: Correlations with plasma-enhances chemical vapor deposition conditions", J. Mater. Res., 2000, 15(3): 704-717.

Gruniger et al., "Influence of film structure and composition on diffusion barrier performance of SiOx thin films deposited by PECVD", Surface and Coatings Technology, 2006, 200:4564-4571.

Nagai et al., "Fabrication of Multilayered SiOCH Films with Low Dielectric Constant Employing Layer-by-Layer Process Enhanced Chemical Vapor Deposition and Oxidation", The Japan Society of Applied Physics, 2003, 2775-2779.

Trunec et al., "Deposition of thin organosilicon polymer films in atmospheric pressure glow discharge", J. Phys. D.: Appl. Phys., 2004, 37:2112-2120.

Gaur and Vergason, "Plasma Polymerization: Theory and Practice", Society of Vacuum Coaters, 43rd Annual Technical Conference Proceedings, Denver, Apr. 15-20, 2000, 267-271.

* cited by examiner

Before cyclic testing

After 58,600 cycles at ε = 0.2%

First crack at ε = 0.4%

Extensive cracking at ε = 2.7%

Bottom-emitting OLEDs

Transparent OLEDs

A

B

A

B

HYBRID LAYERS FOR USE IN COATINGS ON ELECTRONIC DEVICES OR OTHER ARTICLES

This application is a continuation-in-part of U.S. application Ser. No. 11/783,361 (filed 9 Apr. 2007), which claims priority to U.S. Provisional Application Ser. No. 60/856,047 (filed 1 Nov. 2006). Both applications are incorporated by reference herein in their entirety.

The claimed inventions were made with support from the United States Government, under Contract No. W911QX-06-C-0017, awarded by the Army Research Office. The U.S. Government may have certain rights in this invention.

The claimed inventions were made by, on behalf of, and/or in connection with one or more of the following parties to a joint university corporation research agreement: Princeton University, The University of Southern California, and the Universal Display Corporation. The agreement was in effect on and before the date the claimed inventions were made, and the claimed inventions were made as a result of activities undertaken within the scope of the agreement.

TECHNICAL FIELD

The present invention relates to barrier coatings for electronic devices.

BACKGROUND

Organic electronic devices, such as organic light-emitting devices (OLEDs), are vulnerable to degradation when exposed to water vapor or oxygen. A protective barrier coating over the OLED to reduce its exposure to water vapor or oxygen could help to improve the lifetime and performance of the device. Films of silicon oxide, silicon nitride, or aluminum oxide, which have been successfully used in food packaging, have been considered for use as barrier coatings for OLEDs. However, these inorganic films tend to contain microscopic defects which allow some diffusion of water vapor and oxygen through the film. In some cases, the defects open as cracks in the brittle film. While this level of water and oxygen diffusion may be acceptable for food products, it is not acceptable for OLEDs. To address these problems, multilayer barrier coatings that use alternating inorganic and polymer layers have been tested on OLEDs and found to have improved resistance to water vapor and oxygen penetration. But these multilayer coatings have the disadvantages of complexity and cost. Thus, there is a need for other methods of forming barrier coatings suitable for use in protecting OLEDs.

SUMMARY

In one aspect, the present invention provides a method for forming a coating over a surface, comprising: providing a source of precursor material; transporting the precursor material to a reaction location adjacent a surface to be coated; and depositing a hybrid layer over the surface by chemical vapor deposition using the source of precursor material, wherein the hybrid layer comprises a mixture of a polymeric material and a non-polymeric material, wherein the weight ratio of polymeric to non-polymeric material is in the range of 95:5 to 5:95, and wherein the polymeric material and the non-polymeric material are created from the same source of precursor material.

In another aspect, the present invention provides a method for forming a multi-layered coating over a surface, comprising: providing a source of precursor material; transporting the precursor material to a reaction location adjacent a surface to be coated; and depositing a plurality of hybrid layers over the surface by chemical vapor deposition using the source of precursor material, wherein each hybrid layer independently comprises a mixture of a polymeric material and a non-polymeric material, wherein the weight ratio of polymeric to non-polymeric material is in the range of 95:5 to 5:95, and wherein the polymeric material and the non-polymeric material are created from the same source of precursor material.

In another aspect, the present invention provides a method for forming a coating having improved interfacial cohesion with a surface on which the coating is deposited, comprising: providing a substrate having a surface; pretreating the surface to be coated; providing a source of precursor material; transporting the precursor material to a reaction location adjacent to the pretreated surface; and depositing a hybrid layer over the surface by chemical vapor deposition using the source of precursor material, wherein the hybrid layer comprises a mixture of a polymeric material and a non-polymeric material, wherein the weight ratio of polymeric to non-polymeric material is in the range of 95:5 to 5:95, and wherein the polymeric material and the non-polymeric material are created from the same source of precursor material.

In another aspect, the present invention provides a method of protecting an electronic device disposed on a surface serving as a foundation for the electronic device, comprising: forming a coating over the electronic device, comprising the steps of: (a) providing a source of precursor material; (b) transporting the precursor material to a reaction location adjacent the electronic device to be coated; and (c) depositing a hybrid layer over the electronic device by chemical vapor deposition using the source of precursor material, wherein the hybrid layer comprises a mixture of a polymeric material and a non-polymeric material, wherein the weight ratio of polymeric to non-polymeric material is in the range of 95:5 to 5:95, and wherein the polymeric material and the non-polymeric material are created from the same source of precursor material.

In another aspect, the present invention provides a method for controlling a property of a coating formed over a surface, comprising: providing a source of precursor material; transporting the precursor material to a reaction location adjacent a surface to be coated; depositing a hybrid layer over the surface by chemical vapor deposition using the source of precursor material, wherein the hybrid layer comprises a mixture of a polymeric material and a non-polymeric material, wherein the weight ratio of polymeric to non-polymeric material is in the range of 95:5 to 5:95, and wherein the polymeric material and the non-polymeric material are created from the same source of precursor material; and controlling the conditions under which the hybrid layer is deposited.

DETAILED DESCRIPTION

Figure 1:
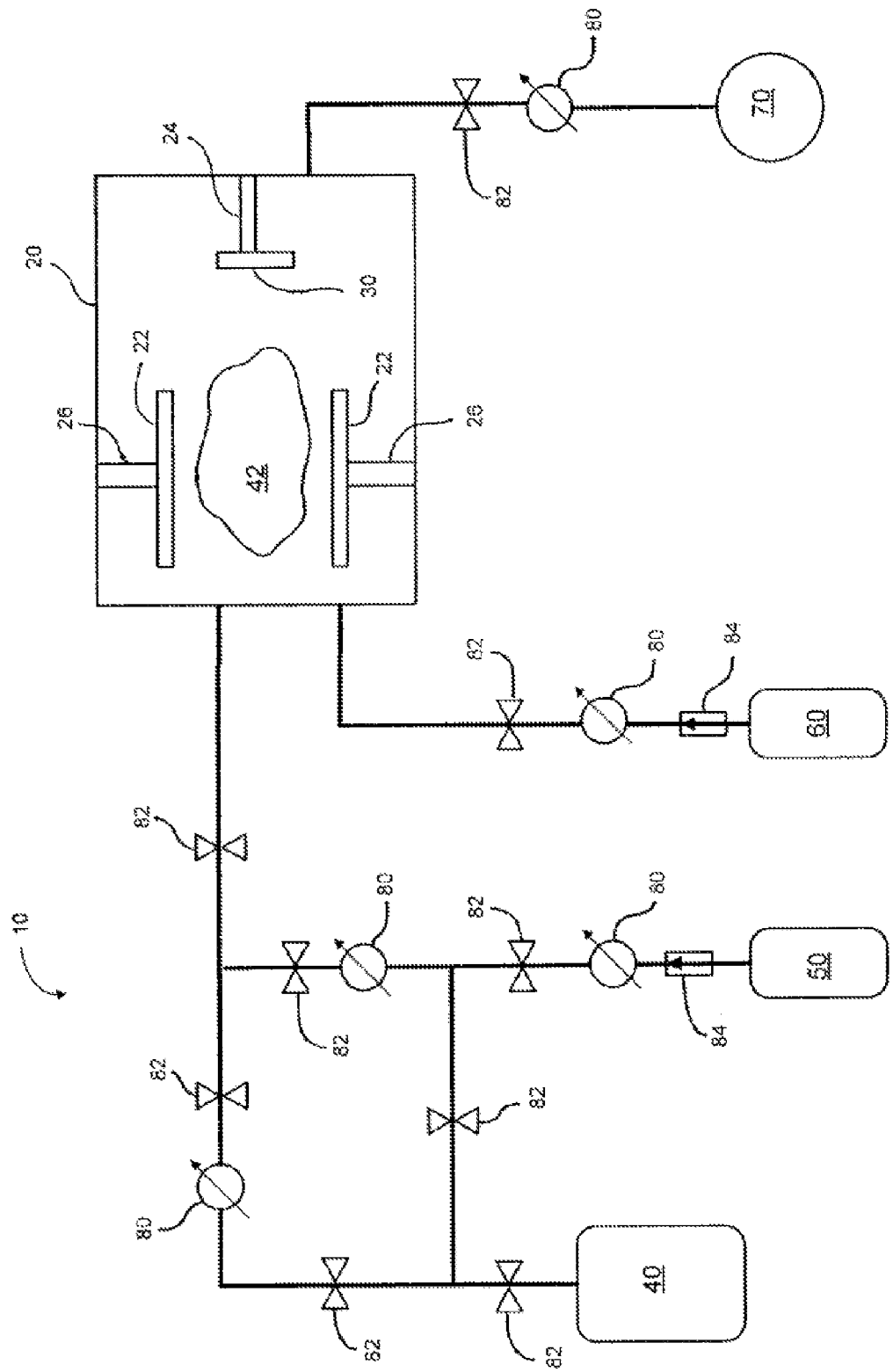
FIG. 1 shows a schematic diagram of a PE-CVD apparatus that can be used for implementing certain embodiments of the present invention.

In one aspect, the present invention provides a method for forming a coating over a surface. The method comprises depositing over the surface, a hybrid layer comprising a mixture of a polymeric material and a non-polymeric material. The hybrid layer may have a single phase or multiple phases.

As used herein, the term "non-polymeric" refers to a material made of molecules having a well-defined chemical formula with a single, well-defined molecular weight. A "non-polymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. Polymers include, but are not limited to homopolymers and copolymers such as block, graft, random, or alternating copolymers, as well as blends and modifications thereof. Polymers include, but are not limited to, polymers of carbon or silicon.

As used herein, a "mixture of a polymeric material and a non-polymeric material" refers to a composition that one of ordinary skill in the art would understand to be neither purely polymeric nor purely non-polymeric. The term "mixture" is intended to exclude any polymeric materials that contain incidental amounts of non-polymeric material (that may, for example, be present in the interstices of polymeric materials as a matter of course), but one of ordinary skill in the art would nevertheless consider to be purely polymeric. Likewise, this is intended to exclude any non-polymeric materials that contain incidental amounts of polymeric material, but one of ordinary skill in the art would nevertheless consider to be purely non-polymeric. In some cases, the weight ratio of polymeric to non-polymeric material in the hybrid layer is in the range of 95:5 to 5:95, and preferably in the range of 90:10 to 10:90, and more preferably, in the range of 25:75 to 10:90.

The polymeric/non-polymeric composition of a layer may be determined using various techniques, including wetting contact angles of water droplets, IR absorption, hardness, and flexibility. In certain instances, the hybrid layer has a wetting contact angle in the range of 30° to 85°, and preferably, in the range of 30° to 60°, and more preferably, in the range of 36° to 60°. Note that the wetting contact angle is a measure of composition if determined on the surface of an as-deposited film. Because the wetting contact angle can vary greatly by post-deposition treatments, measurements taken after such treatments may not accurately reflect the layer's composition. It is believed that these wetting contact angles are applicable to a wide range of layers formed from organo-silicon precursors. In certain instances, the hybrid layer has a nano-indentation hardness in the range of 3 to 20 GPa, and preferably, in the range of 10 to 18 GPa. In certain instances, the hybrid layer has a surface roughness (root-mean-square) in the range of 0.1 nm to 10 nm, and preferably, in the range of 0.2 nm to 0.35 nm. In certain instances, the hybrid layer, when deposited as a 4 μm thick layer on a 50 μm thick polyimide foil substrate, is sufficiently flexible that no microstructural changes are observed after at least 55,000 rolling cycles on a 1 inch diameter roll at a tensile strain (∈) of 0.2%. In certain instances, the hybrid layer is sufficiently flexible that no cracks appear under a tensile strain (∈) of at least 0.35% (a tensile strain level which would normally crack a 4 μm pure silicon oxide layer, as considered by a person of ordinary skill in the art).

The term "mixture" is intended to include compositions having a single phase as well as compositions having multiple phases. Therefore, a "mixture" excludes subsequently deposited alternating polymeric and non-polymeric layers. Put another way, to be considered a "mixture," a layer should be deposited under the same reaction conditions and/or at the same time.

The hybrid layer is formed by chemical vapor deposition using a single source of precursor material. As used herein, "single source of precursor material" refers to a source that provides all the precursor materials that are necessary to form both the polymeric and non-polymeric materials when the precursor material is deposited by CVD, with or without a reactant gas. This is intended to exclude methods where the polymeric material is formed using one precursor material, and the non-polymeric material is formed using a different precursor material. By using a single source of precursor material, the deposition process is simplified. For example, a single source of precursor material will obviate the need for separate streams of precursor materials and the attendant need to supply and control the separate streams.

The precursor material may be a single compound or a mixture of compounds. Where the precursor material is a mixture of compounds, in some cases, each of the different compounds in the mixture is, by itself, able to independently serve as a precursor material. For example, the precursor material may be a mixture of hexamethyl disiloxane (HMDSO) and dimethyl siloxane (DMSO).

In some cases, plasma-enhanced CVD (PE-CVD) may be used for deposition of the hybrid layer. PE-CVD may be desirable for various reasons, including low temperature deposition, uniform coating formation, and controllable process parameters. Various PE-CVD processes which are suitable for use in the present invention are known in the art, including those that use RF energy to generate the plasma.

The precursor material is a material that is capable of forming both a polymeric material and a non-polymeric material when deposited by chemical vapor deposition. Various such precursor materials are suitable for use in the present invention and are chosen for their various characteristics. For example, a precursor material may be chosen for its content of chemical elements, its stoichiometric ratios of the chemical elements, and/or the polymeric and non-polymeric materials that are formed under CVD. For instance, organo-silicon compounds, such as siloxanes, are a class of compounds suitable for use as the precursor material. Representative examples of siloxane compounds include hexamethyl disiloxane (HMDSO) and dimethyl siloxane (DMSO). When deposited by CVD, these siloxane compounds are able to form polymeric materials, such as silicone polymers, and non-polymeric materials, such as silicon oxide. The precursor material may also be chosen for various other characteristics such as cost, non-toxicity, handling characteristics, ability to maintain liquid phase at room temperature, volatility, molecular weight, etc.

Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen-containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organo-silicon compounds suitable for use as a precursor material include: hexamethyldisilazane; divinyltetramethyldisilizane; hexamethylcyclotrisilazane; dimethylbis(N-methylacetamido)silane; dimethylbis-(N-ethylacetamido)silane; methylvinylbis(N-methylacetamido)silane; methylvinylbis(N-butylacetamido)silane; methyltris(N-phenylacetamido)silane; vinyltris(N-ethylacetamido)silane; tetrakis(N-methylacetamido)silane; diphenylbis(diethylaminoxy)silane; methyltris(diethylaminoxy)silane; and bis(trimethylsilyl)carbodiimide.

When deposited by CVD, the precursor material may form various types of polymeric materials in various amounts, depending upon the type of precursor material, the presence of any reactant gases, and other reaction conditions. The polymeric material may be inorganic or organic. For example, where organo-silicon compounds are used as the precursor material, the deposited hybrid layer may include polymer chains of Si—O bonds, Si—C bonds, or Si—O—C bonds to form polysiloxanes, polycarbosilanes, and polysilanes, as well as organic polymers.

When deposited by CVD, the precursor material may form various types of non-polymeric materials in various amounts, depending upon the type of precursor material, the presence of any reactant gases, and other reaction conditions. The non-polymeric material may be inorganic or organic. For example, where organo-silicon compounds are used as the precursor material in combination with an oxygen-containing reactant gas, the non-polymeric material may include silicon oxides, such as SiO, $SiO_2$, and mixed-valence oxides $SiO_x$. When deposited with a nitrogen-containing reactant gas, the non-polymeric material may include silicon nitrides ($SiN_x$). Other non-polymeric materials that may be formed include silicon oxycarbide and silicon oxynitrides.

When using PE-CVD, the precursor material may be used in conjunction with a reactant gas that reacts with the precursor material in the PE-CVD process. The use of reactant gases in PE-CVD is known in the art and various reactant gases are suitable for use in the present invention, including oxygen-containing gases (e.g., $O_2$, ozone, water) and nitrogen-containing gases (e.g., ammonia). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. One way is to vary the concentration of the precursor material or the reactant gas in the reaction. Another way is to vary the flow rates of the precursor material or the reactant gas into the reaction. Another way is to vary the type of precursor material or reactant gas used in the reaction.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the amount of non-polymeric material relative to the polymeric material in the hybrid layer. By increasing the stoichiometric ratio of oxygen in relation to the silicon or carbon, the amount of non-polymeric material, such as silicon oxides, may be increased. Similarly, by reducing the stoichiometric ratio of oxygen, the amount of silicon and carbon-containing polymeric material may be increased. The composition of the hybrid layer may also be varied by adjusting other reaction conditions. For example, in the case of PE-CVD, process parameters such as RF power and frequency, deposition pressure, deposition time, and gas flow rates can be varied.

Thus, by using the methods of the present invention, it is possible to form a hybrid layer of hybrid polymeric/non-polymeric character and having characteristics suitable for use in various applications. Such characteristics include optical transparency (e.g., in some cases, the hybrid layer is optically transparent), impermeability, flexibility, thickness, adhesion, and other mechanical properties. For example, one or more of these characteristics may be adjusted by varying the weight % of polymeric material in the hybrid layer, with the remainder being non-polymeric material. For instance, to achieve a desired level of flexibility and impermeability, the wt % polymeric material may preferably be in the range of 5 to 95%, and more preferably in the range of 10 to 25%. However, other ranges are also possible depending upon the application.

Barrier layers made of purely non-polymeric materials, such as silicon oxide, can have various advantages relating to optical transparency, good adhesion, and good film stress. However, these non-polymeric layers tend to contain microscopic defects which allow the diffusion of water vapor and oxygen through the layer. Providing some polymeric character to the non-polymeric layer can reduce the permeability of the layer without significantly altering the advantageous properties of a purely non-polymeric layer. Without intending to be bound by theory, the inventors believe that a layer having a hybrid polymeric/non-polymeric character reduces the permeability of the layer by reducing the size and/or number of defects, in particular micro cracks.

In some cases, the coating of the present invention may have a plurality of hybrid layers, wherein the composition of each hybrid layer can vary independently. In some cases, the weight % ratio of one hybrid layer differs by at least 10 weight % from another hybrid layer in the coating. The thickness of each hybrid layer can also vary independently. The different hybrid layers can be created by sequentially adjusting the reaction conditions used in depositing the hybrid layer. For example, in a PE-CVD process, the amount of reactant gas provided to the reaction mixture may be adjusted sequentially to produce multiple hybrid layers, with each hybrid layer being discrete and having a different composition.

Where the coating has a zone where its composition changes substantially continuously from one elevation to another, a hybrid layer within that zone may be very thin, even as thin as the smallest molecular unit within the coating. For example, the coating may have a zone where the wt % ratio of polymeric material to non-polymeric material varies continuously. The continuous variation may be linear (e.g., the wt % ratio of polymeric to non-polymeric material may steadily increase with higher elevation) or non-linear (e.g., cyclically increasing and decreasing).

The hybrid layer may be deposited over various types of articles. In some cases, the article may be an organic electronic device, such as an OLED. For an OLED, the hybrid layer may serve as a barrier coating that resists permeation of water vapor and oxygen. For example, a hybrid layer having a water vapor transmission rate of less than $10^{-6}$ g/m$^2$/day and/or an oxygen transmission rate of less than $10^{-3}$ g/m$^2$/day may be suitable for protecting OLEDs. In some cases, the thickness of the hybrid layer can range from 0.1 to 10 μm, but other thicknesses can also be used depending upon the application. Also, hybrid layers having a thickness and material composition that confers optical transparency may be suitable for use with OLEDs. For use with flexible OLEDs, the hybrid layer may be designed to have the desired amount of flexibility. In some cases, the hybrid layer may be used on other articles that are sensitive to degradation upon exposure to the environment, such as pharmaceuticals, medical devices, biologic agents, biological samples, biosensors, or sensitive measuring equipment.

In some cases, the hybrid layer may be used in combination with an unmixed layer that can also be formed by using the same single source of precursor material, such as an unmixed polymeric layer or an unmixed non-polymeric layer. The unmixed layer may be deposited before or after the hybrid layer is deposited.

Any of various types of CVD reactors may be used to implement the methods of the present invention. As one example, FIG. 1 shows a PE-CVD apparatus 10 that can be used to implement certain embodiments of the present invention. PE-CVD apparatus 10 comprises a reaction chamber 20 in which an electronic device 30 is loaded onto a holder 24. Reaction chamber 20 is designed to contain a vacuum and a vacuum pump 70 is connected to reaction chamber 20 to create and/or maintain the appropriate pressure. An N$_2$ gas tank 50 provides N$_2$ gas for purging apparatus 10. Reaction chamber 20 may further include a cooling system to reduce the heat that is generated by the reaction.

For handling the flow of gases, apparatus 10 also includes various flow control mechanisms (such as mass flow controllers 80, shut-off valves 82, and check valves 84) which may be under manual or automated control. A precursor material source 40 provides a precursor material (e.g., HMDSO in liquid form) which is vaporized and fed into reaction chamber 20. In some cases, the precursor material may be transported to reaction chamber 20 using a carrier gas, such as argon. A reactant gas tank 60 provides the reactant gas (e.g., oxygen), which is also fed into reaction chamber 20. The precursor material and reactant gas flow into reaction chamber 20 to create a reaction mixture 42. The pressure inside reaction chamber 20 may be adjusted further to achieve the deposition pressure. Reaction chamber 20 includes a set of electrodes 22 mounted on electrode standoffs 26, which may be conductors or insulators. A variety of arrangements of device 30 and electrodes 22 are possible. Diode or triode electrodes, or remote electrodes may be used. Device 30 may be positioned remotely as shown in FIG. 1, or may be mounted on one or both electrodes of a diode configuration.

Electrodes 22 are supplied with RF power to create plasma conditions in the reaction mixture 42. Reaction products created by the plasma are deposited onto electronic device 30. The reaction is allowed to proceed for a period of time sufficient to deposit a hybrid layer on electronic device 30. The reaction time will depend upon various factors, such as the position of device 30 with respect to electrodes 22, the type of hybrid layer to be deposited, the reaction conditions, the desired thickness of the hybrid layer, the precursor material, and the reactant gas. The reaction time may be a duration between 5 seconds to 5 hours, but longer or shorter times may also be used depending upon the application.

Table 1 below shows the reaction conditions that were used to make three example hybrid layers. The hybrid layer of Example 1 contained approximately 7% polymeric material and 93% non-polymeric material, as determined from the wetting contact angles of water droplets. The hybrid layer of Example 2 contained approximately 94% polymeric material and 6% non-polymeric material, as determined from the wetting contact angles of water droplets. The hybrid layer of Example 3 contained approximately 25% polymeric material and 75% non-polymeric material, as determined from the wetting contact angles of water droplets.

TABLE 1

| Hybrid Layer | HMDSO source temp (° C.) | HMDSO gas flow rate (sccm) | O$_2$ gas flow rate (sccm) | Pressure (m torr) | RF power (W) | Deposition time (min) | Film thickness (Å) |
| --- | --- | --- | --- | --- | --- | --- | --- |
| Example 1 | 33 | 0.4 | 300 | 600 | 5 | 30 | 800 |
| Example 2 | 33 | 10 | 13 | 130 | 18 | 10 | 1,600 |
| Example 3 | 33 | 1.5 | 50 | 150 | 60 | 135 | 60,000 |

Figure 2:
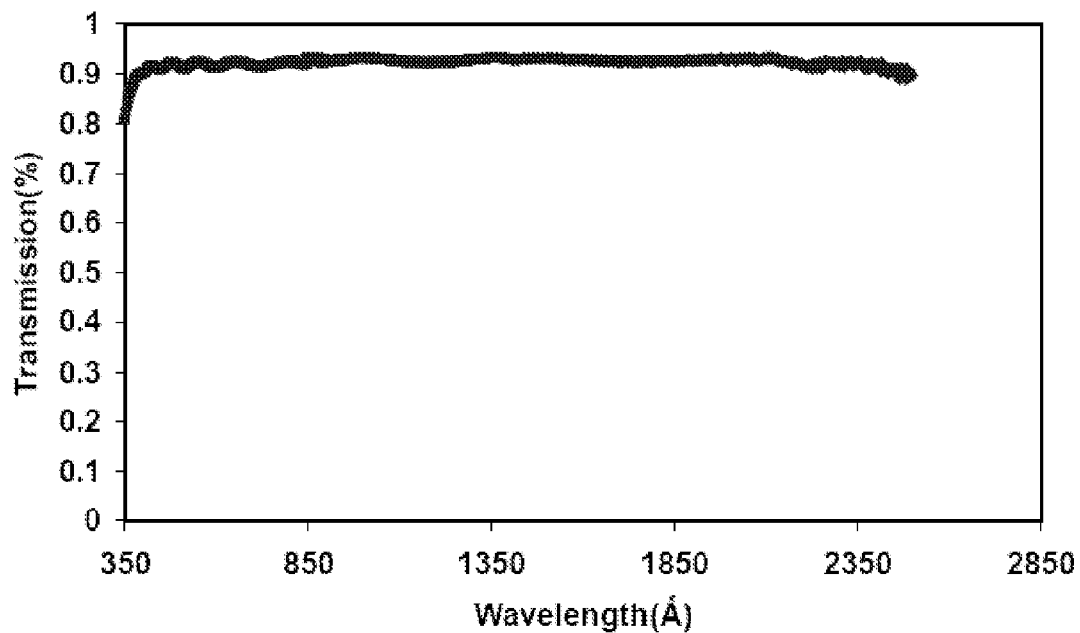
FIG. 2 shows the optical transmission spectrum of a hybrid layer according to an embodiment.
Figure 3:
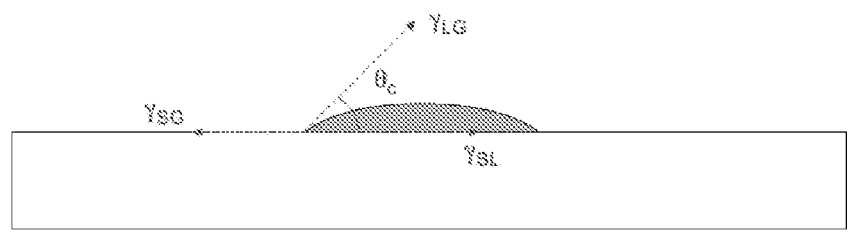
FIG. 3 shows how the contact angle of a water droplet on a film is measured.
Figure 4:
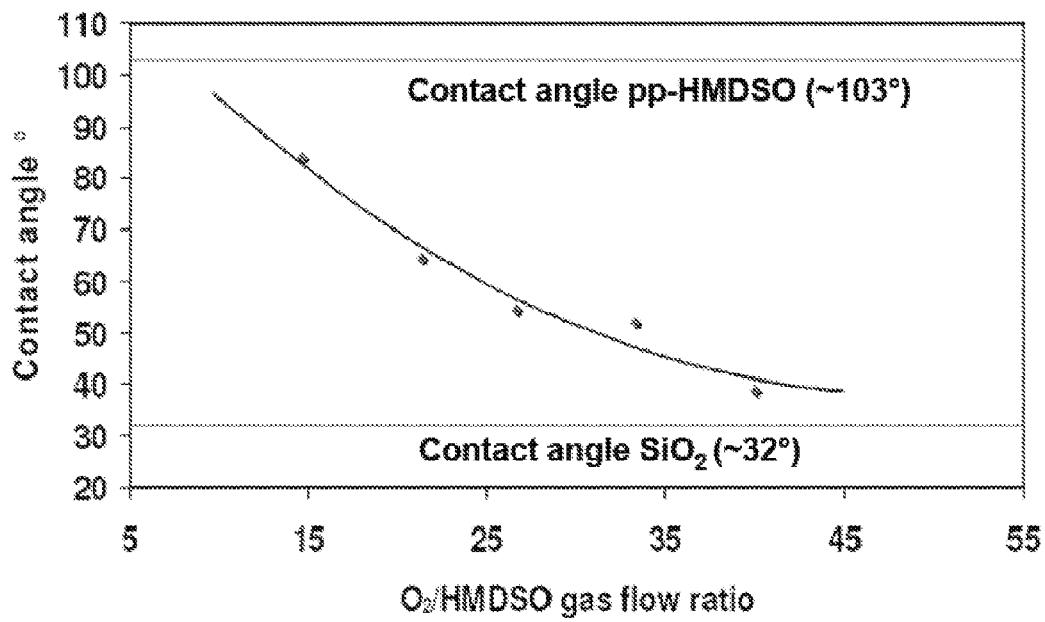
FIG. 4 shows a plot of the contact angles of several hybrid layers formed under various $O_2$/HMDSO gas flow ratios.

FIG. 2 shows the optical transmission spectrum of the hybrid layer of Example 3. This hybrid layer has greater than 90% transmittance from the near-UV to the near-IR spectrum. FIG. 3 shows how the contact angle of a water droplet on a film is measured. FIG. 4 is a plot of the contact angles of several hybrid layers formed under various $O_2$/HMDSO gas flow ratios in comparison to the contact angles of a pure $SiO_2$ film and a pure polymer film. The contact angles of the hybrid layers approach that of a pure $SiO_2$ film as the oxygen flow rate in the deposition process increases.

Figure 5:
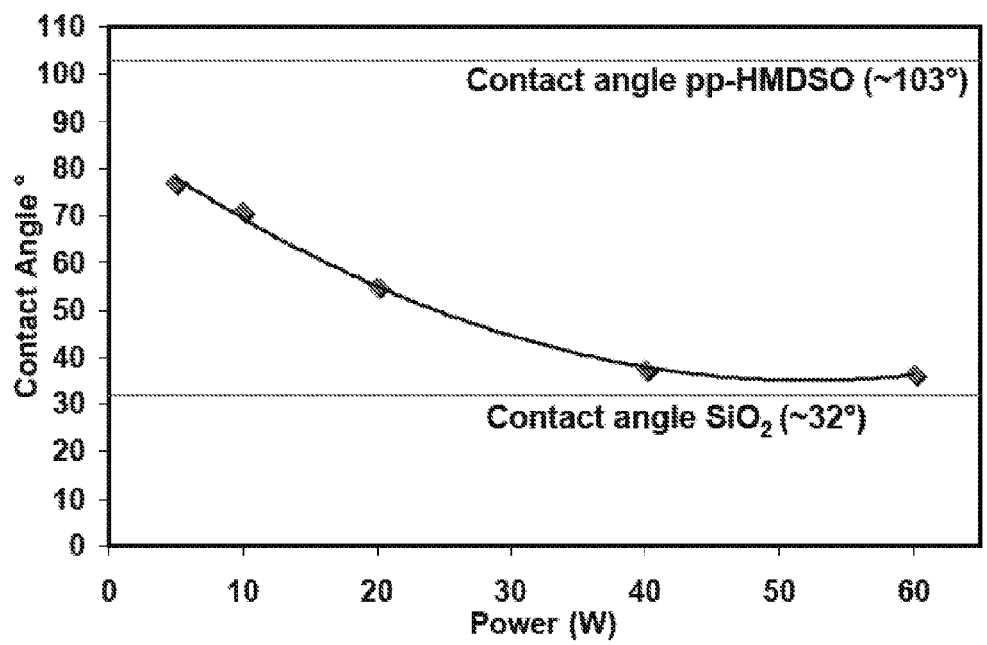
FIG. 5 shows a plot of the contact angles of several hybrid layers formed under various power levels applied during the PE-CVD process.
Figure 6:
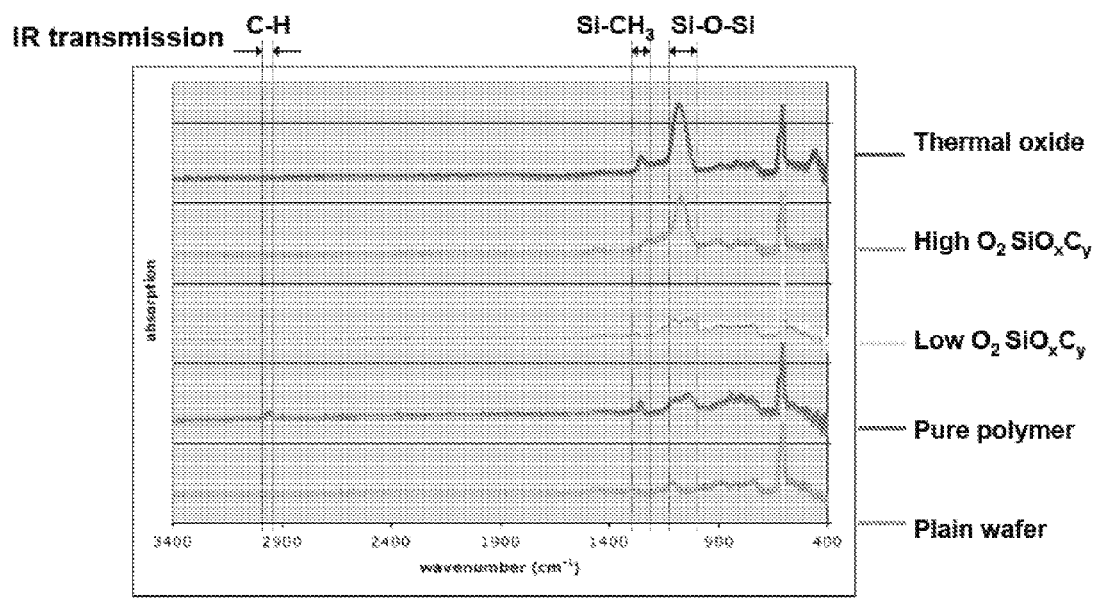
FIG. 6 shows the infrared absorption spectra of hybrid layers formed using a relatively high $O_2$ flow and a relatively low $O_2$ flow in comparison to films of pure $SiO_2$ (thermal oxide) or pure polymer.
Figure 7:
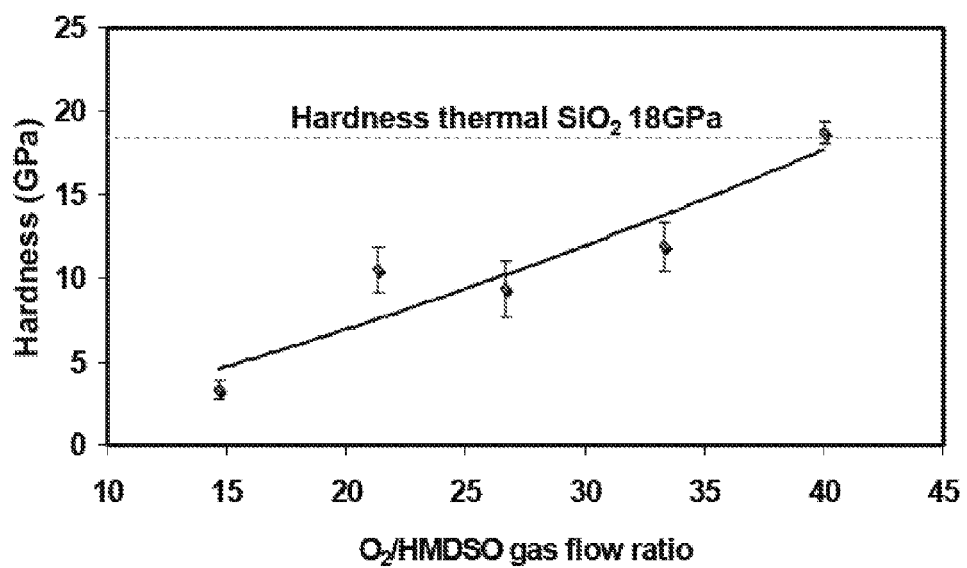
FIG. 7 shows a plot of the nano-indentation hardness of various hybrid layers formed under various $O_2$/HMDSO gas flow ratios in comparison to the hardness of a pure $SiO_2$ film.

FIG. 5 is a plot of the contact angles of several hybrid layers formed under various power levels applied during the PE-CVD process. The contact angles of the hybrid layers approach that of a pure $SiO_2$ film as the power level increases, which may be due to the fact that higher power levels make $O_2$ a stronger oxidant. FIG. 6 shows the infrared absorption spectra of hybrid layers formed using a relatively high $O_2$ flow and a relatively low $O_2$ flow in comparison to films of pure $SiO_2$ (thermal oxide) or pure polymer. The high $O_2$ hybrid layer shows strong peaks in the Si—O—Si band. The nominal peaks in the Si—$CH_3$ band for the thermal oxide (pure $SiO_2$) film are believed to be related to Si—O vibrations. FIG. 7 is a plot of the nano-indentation hardness of various hybrid layers formed under various $O_2$/HMDSO gas flow ratios in comparison to the hardness of a pure $SiO_2$ film. The hardness of the hybrid layers increase as the oxygen flow rate in the deposition process increases, and these hybrid layers can be nearly as hard pure $SiO_2$ films, and yet be tough and highly flexible.

Figure 8:
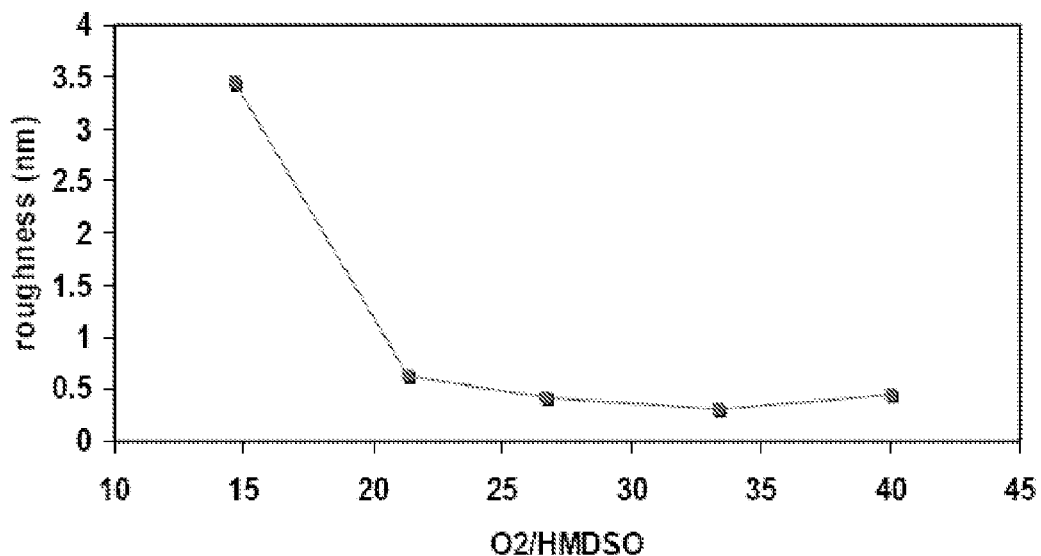
FIG. 8 shows a plot of the surface roughness of several hybrid layers formed under various $O_2$/HMDSO gas flow ratios.
Figure 9:
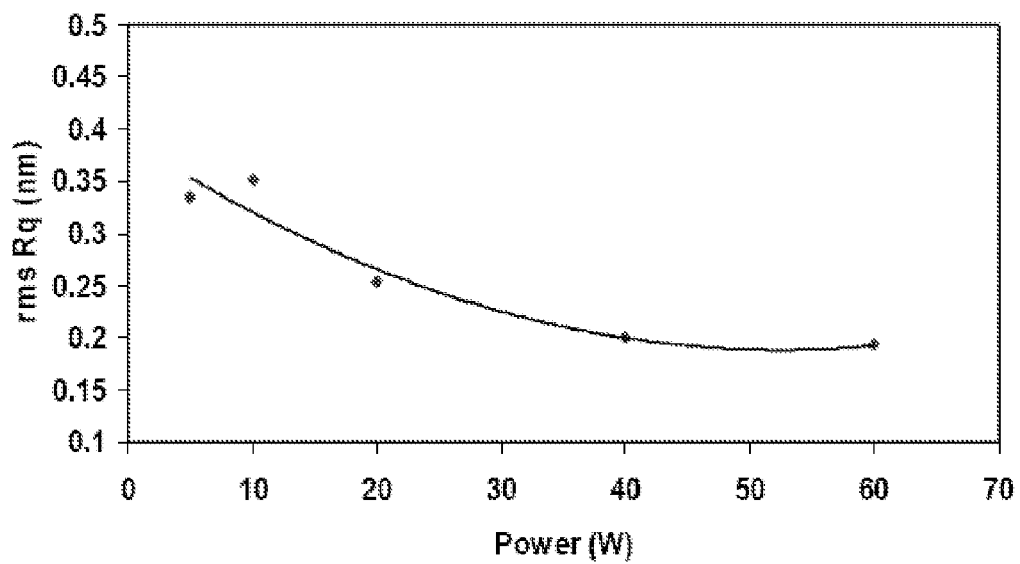
FIG. 9 shows a plot of the surface roughness of several hybrid layers formed under various power levels.

FIG. 8 is a plot of the surface roughness (root-mean-square), measured by atomic force microscopy, of several hybrid layers formed under various $O_2$/HMDSO gas flow ratios, and shows that the surface roughness decreases with increasing $O_2$ flow rates used in the deposition process. FIG. 9 is a plot of the surface roughness (root-mean-square), measured by atomic force microscopy, of several hybrid layers formed under various power levels, and shows that the surface roughness decreases with increasing power levels used in the deposition process.

Figure 10A:
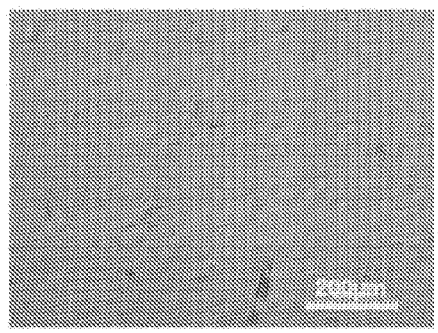
FIGS. 10A and 10B show optical micrographs of the surface of a 4 μm hybrid layer deposited on a 50 μm thick Kapton polyimide foil.
Figure 10A:
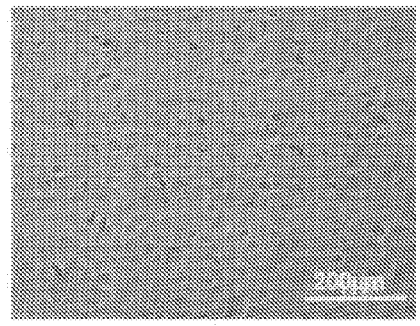
Figure 10B:
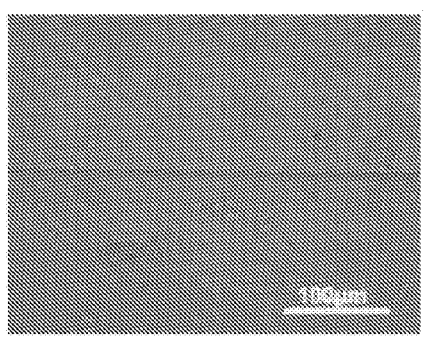
Figure 10B:
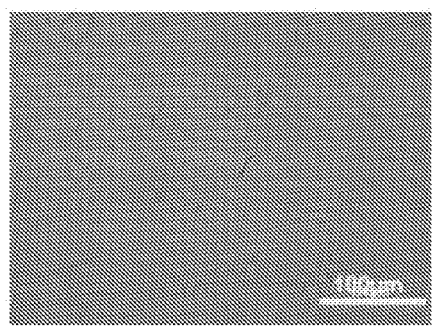

FIGS. 10A and 10B show optical micrographs of the surface of a 4 μm hybrid layer (deposited under the same source temperature, gas flow rates, pressure, and RF power of Example 3 above) on a 50 μm thick Kapton polyimide foil. In FIG. 10A, the images were obtained before and after the coated foil was subjected to cyclic rolling on a 1 inch diameter roll (tensile strain ∈=0.2%). No microstructural changes were observed after 58,600 rolling cycles. In FIG. 10B, the coated foil was subjected to increasing tensile strain, and the images were obtained after the appearance of first cracking (roll diameter of 14 mm) and after extensive cracking (roll diameter of 2 mm). These flexibility results demonstrate that the methods of the present invention can provide a coating that is highly flexible.

Figure 11:
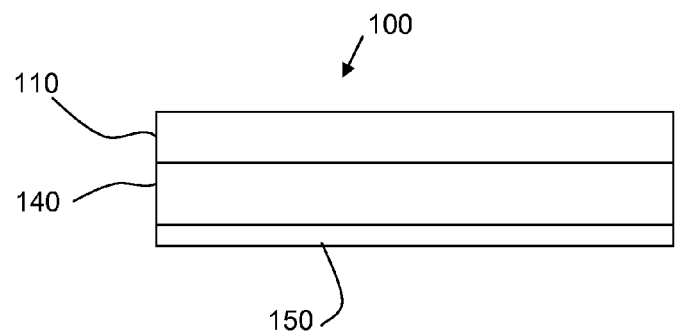
FIG. 11 shows a cross-sectional view of a portion of an encapsulated OLED according to an embodiment.
Figure 12:
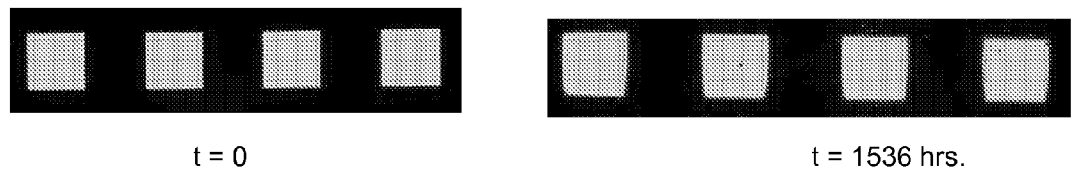
FIG. 12 shows the results of accelerated environmental tests of complete OLEDs with barrier coatings.
Figure 12:
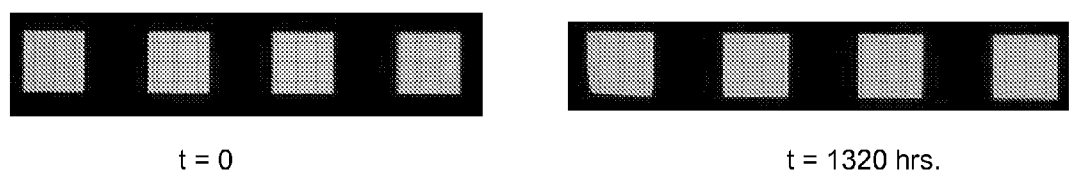

FIG. 11 shows a cross-sectional view of a portion of an encapsulated OLED 100, which comprises the OLED proper 140 on a substrate 150, and the hybrid layer of Example 3 above, as a barrier coating 110. FIG. 12 shows the results of accelerated environmental tests of complete OLEDs with barrier coatings. Both bottom-emitting OLEDs and transparent OLEDs were coated with the 6-μm thick hybrid layer of Example 3. The devices were then operated in an environmental chamber at 65° C. and 85% relative humidity. The images show the condition of the OLEDs at the initial time point and after the indicated time intervals. The OLEDs continued to function after well over 1000 hours, demonstrating that the methods of the present invention can provide a coating that effectively protects against the degradative effects of environmental exposure.

In instances where the hybrid layer is used as an environmental barrier for an electronic device, the hybrid layer may serve as the surface upon which the electronic device is disposed, the cover for the electronic device, or both. For example, one hybrid layer may be deposited over the electronic device to cover it and another hybrid layer may be deposited on the substrate below the electronic device to provide a surface upon which the electronic device is disposed. In this way, the electronic device is sealed between the two hybrid layers.

Figure 13:
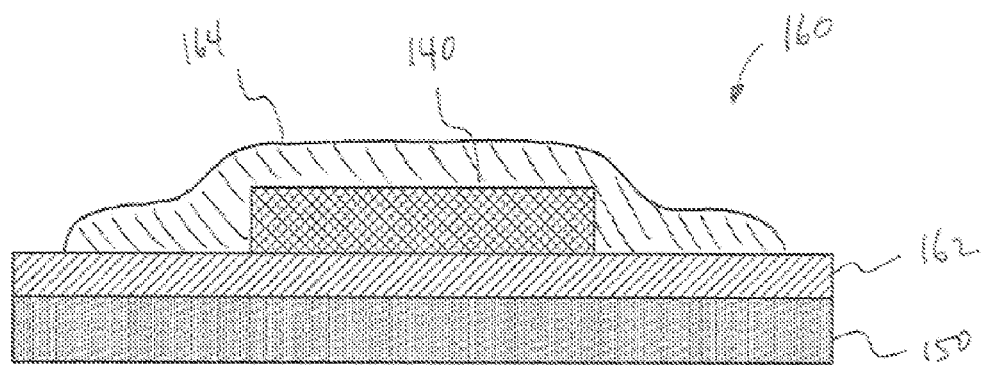
FIG. 13 shows an encapsulated OLED according to another embodiment.

For example, referring to the embodiment shown in FIG. 13, an encapsulated OLED 160 comprises a substrate 150 with a hybrid layer 162 deposited thereon. The body 140 of the OLED (including the electrodes) is disposed on the surface of hybrid layer 162. Another hybrid layer 164, which may or may not have the same composition as hybrid layer 162, is deposited over OLED body 140 as a conformal coating. As such, in addition to covering the top of OLED body 140, hybrid layer 164 also extends down the sides of OLED body 140 and contacts the surface of hybrid layer 162. In this way, OLED body 140 is sandwiched between hybrid layer 162 and hybrid layer 164.

In certain embodiments, the surface on which the hybrid layer is deposited may be pretreated prior to depositing the hybrid layer in order to increase the interfacial cohesion between the surface and the hybrid layer. The surface pretreatment may modify various surface properties, including enhancing the adhesiveness of the surface, modifying the surface chemistry (e.g., activating the surface), changing the surface roughness, increasing the surface energy, planarizing the surface, and/or cleaning the surface. By increasing the interfacial cohesion between the surface and the hybrid layer, this feature can be useful in reducing the lateral diffusion of environmental contaminants (such as moisture or oxygen) from the edges of the hybrid layer.

Various types of surface treatments that can increase the interfacial cohesion between the surface and the hybrid layer are suitable for use in the present invention, including mechanical abrasion, chemical treatments (e.g., exposure to oxidizing agents, activation by introduction of functional groups) or physical-chemical treatments (e.g., exposure to plasma, corona discharge, or UV irradiation). Where plasma treatment is used, the treatment may be performed in the same chamber used to deposit the hybrid layer, or the plasma treatment may be performed in a separate apparatus, in which case, any of the various types of plasma treatment apparatuses known in the art may be used, including barrel-type plasma systems and parallel-plate type plasma systems.

Any of the various gases conventionally used in plasma treatments may be suitable for pretreating the surface, including gases such as oxygen, hydrogen, nitrogen, argon, ammonia, or mixtures thereof. Particularly preferred gases include oxygen and argon. Different gases may be used to modify the surface in different ways. For example, plasma treatment with argon gas will bombard the surface with argon ions, which can clean the surface or make it rougher on an atomic scale, thereby improving its ability to adhere to the hybrid layer. Plasma treatment with oxygen can chemically activate the surface with oxygen-containing functional groups, which can form bonds with the hybrid layer. In order to achieve the desired surface property, various other parameters of the plasma treatment process can be adjusted, including the power, frequency, duration, pressure, or temperature.

In some cases, the surface may be pretreated by disposing an intervening layer between the surface and the hybrid layer. The intervening layer comprises any of the various materials which can serve to improve the interfacial cohesion between the surface and the hybrid layer. For example, suitable materials for use in the intervening layer include silicon nitride, chromium, titanium, a nickel-titanium alloy, or a dielectric material. This layer may be deposited using any of various techniques conventionally used for the deposition of thin films, including chemical vapor deposition, plasma vapor deposition, or sputtering. The thickness of the intervening layer will vary according to the particular application. In some cases, the intervening layer may be a mono-atomic or mono-molecular layer, or have a thickness of up to 50 nm, but other thicknesses are also possible in other cases. The material in the intervening layer may further undergo chemical reactions with materials in the layers or structures that are above or below the intervening layer.

Figure 14:
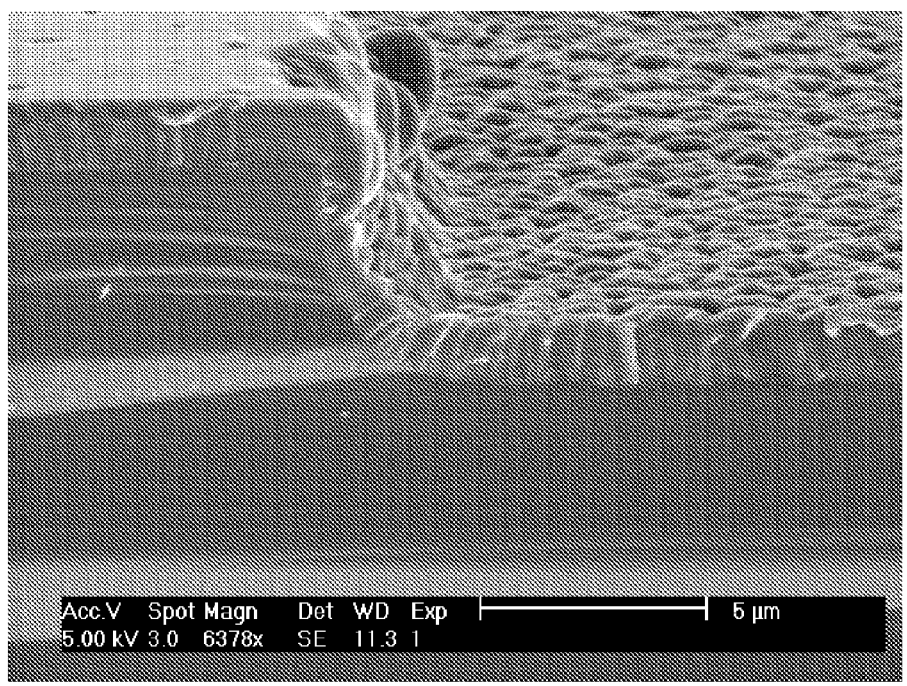
FIG. 14 shows a scanning electron micrograph of a cross-section of a hybrid layer according to another embodiment.

FIG. 14 shows a scanning electron micrograph (SEM) of a cross-section of a hybrid layer deposited onto an etched silicon wafer. The unetched part of the silicon wafer (shown on the left side of FIG. 14 as the raised edge with a 5 μm step height) was covered with an 80 nm film of chromium, which also functioned as the etch mask during the etching of the silicon wafer. The etched portion of the silicon wafer (shown on the right side of FIG. 14) was not pretreated with a chromium film. A hybrid layer was deposited by PE-CVD over both parts of the silicon wafer under the following conditions:

| HMDSO gas flow rate (sccm) | $O_2$ gas flow rate (sccm) | Pressure (m torr) | RF start power (W) | RF deposition power (W) | Total deposition time (min) | Layer thickness (μm) |
| --- | --- | --- | --- | --- | --- | --- |
| 1.55 | 50 | 110-150 | 60 | 60 | 50* | 2.5 |

*In two intermittent periods of 25 min. each, with cooling between each period.

The average temperature of the silicon wafer substrate, through the heating and cooling cycles of the intermittent deposition process, was greater than 80° C. (with a starting temperature of about 22° C. and an ending temperature of about 160° C.). Over the chromium-treated surface, the hybrid layer had a dense microstructure. However, over the untreated surface, the barrier layer has an irregular, columnar microstructure. Based on the morphological differences, the hybrid layer over the chromium-treated surface (having the dense microstructure) can be expected to be less permeable to moisture and oxygen than the hybrid layer deposited over the untreated surface.

In some cases, the intervening layer may be a multi-layered structure comprising one or more planarizing sublayers and one or more adhesion-promoting sublayers. For example, U.S. Pat. No. 6,597,111 (Silvernail et al.) and U.S. Pat. No. 7,187,119 (Weaver) describe barrier layers formed of an alternating series of polymeric planarizing sublayers and high-density sublayers. The polymeric planarizing sublayer comprises a polymeric planarizing material that forms a smooth surface. The high-density sublayer comprises a high-density material (e.g., an inorganic, ceramic, or dielectric material) with sufficiently close atomic spacing such that diffusion of environmental contaminants is hindered. In another example, the intervening layer may comprise multiple alternating layers of spin-coated polymer layers and hybrid layers (deposited in the manner described above); or $SiN_x$ layers and hybrid layers; or spin-coated polymer layers and $SiN_x$ layers.

Figure 15:
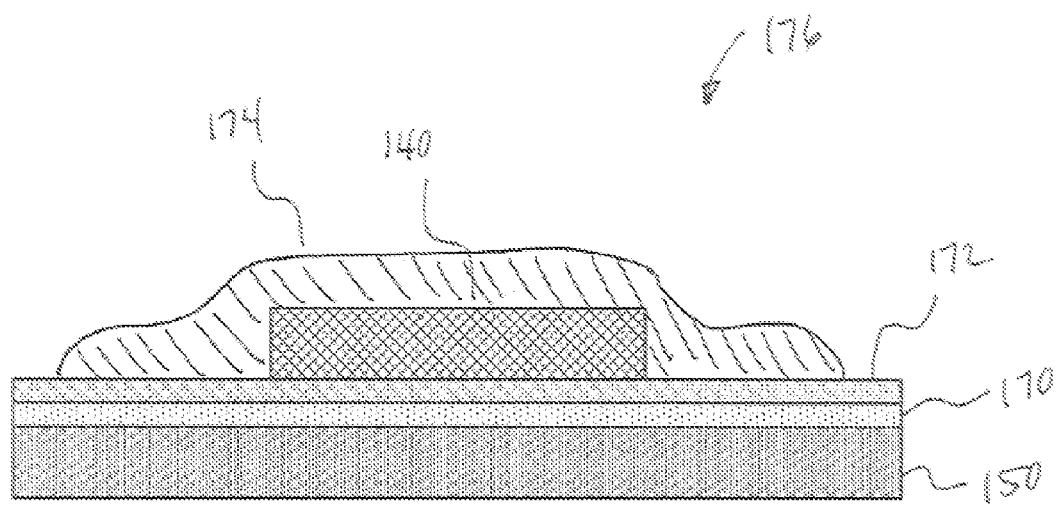
FIG. 15 shows an encapsulated OLED according to another embodiment.

For example, referring to the embodiment shown in FIG. 15, a substrate 150 is coated with a planarizing sublayer 170 of polymeric material. An adhesion-promoting sublayer 172 is disposed on planarizing sublayer 170. The body 140 of an OLED (including the electrodes) is disposed on the surface of adhesion-promoting sublayer 172. A hybrid layer 174 is then deposited over OLED body 140 as a conformal coating. As such, in addition to covering the top of OLED body 140, hybrid layer 174 also extends down the sides of OLED body 140 and contacts the surface of adhesion-promoting sublayer 172. In this way, the adhesion between hybrid layer 174 and adhesion-promoting sublayer 172 can reduce the lateral diffusion of environmental contaminants through the interfacial region.

Figure 16:
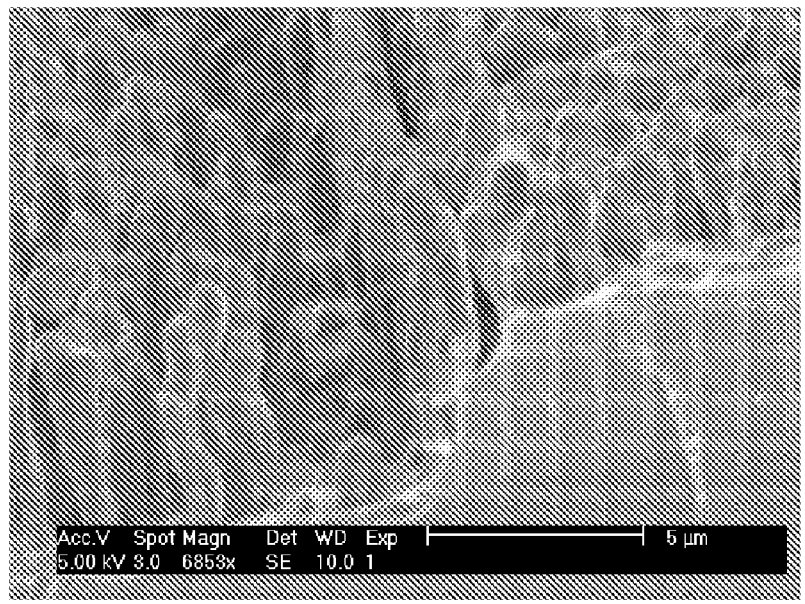
FIGS. 16A and 16B show scanning electron micrographs of a cross-section of a hybrid layer according to another embodiment.
Figure 16:
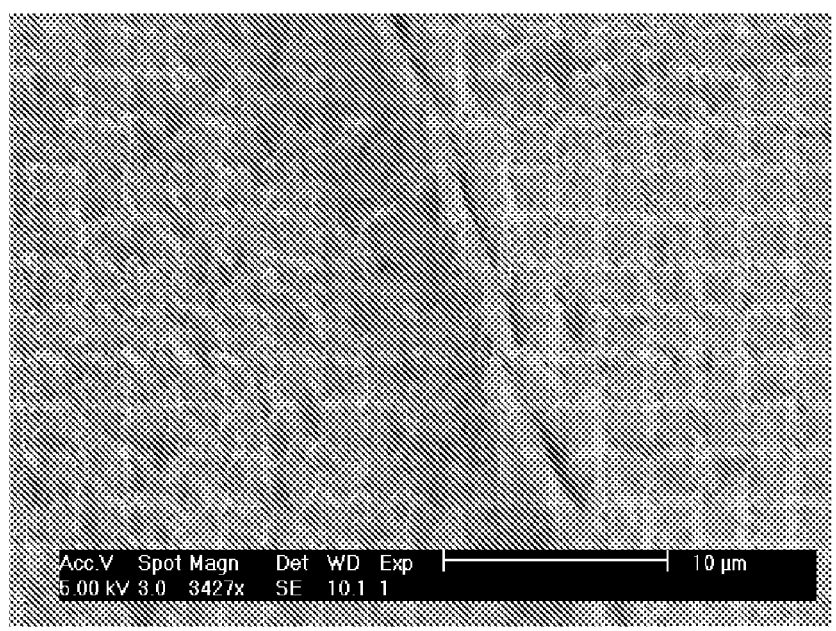

As explained above, the deposition conditions may be varied to provide hybrid layers with different structures, compositions, and/or properties, including its permeability to environmental contaminants and its ability to adhere to the surface on which the hybrid layer is deposited. In some cases, the deposition temperature (e.g., through heating and cooling of the substrate) may be controlled to reduce the permeability of the hybrid layer. FIGS. 16A and 16B show scanning electron micrographs (SEM) of a cross-section of a hybrid layer deposited onto an etched silicon wafer. The unetched part of the silicon wafer (shown on the right sides of FIGS. 16A and 16B as the raised edge) was covered with a thin film of chromium, which also functioned as the etch mask during the etching of the silicon wafer. The etched part of the silicon wafer (shown on the left sides of FIGS. 16A and 16B) was not pretreated with a thin chromium film. A hybrid layer was deposited over both parts of the silicon wafer by PE-CVD under the following conditions:

| HMDSO gas flow rate (sccm) | $O_2$ gas flow rate (sccm) | Pressure (mTorr) | RF start power (W) | RF deposition power (W) | Total deposition time (min) | Layer thickness (μm) |
| --- | --- | --- | --- | --- | --- | --- |
| 1.25 | 40 | 95-125 | 25 | 50 | 90* | 4 |

*In 16 intermittent periods of 5 min. each, with cooling between each period.

The average temperature of the silicon wafer substrate, through the heating and cooling cycles of the intermittent deposition process, was about 35° C. In an intermittent deposition process, one way to control the deposition temperature is to adjust the number or duration of heating and/or cycles. As such, because this hybrid layer was deposited with heating cycles of shorter duration and with a greater number of cooling cycles, the average deposition temperature was lower than that used in depositing the hybrid layer shown in FIG. 14. As a result, the hybrid layer over both the chromium-treated and bare surfaces of the silicon wafer has an irregular, columnar structure. Also, there is poor coverage over the lateral aspects of the step. Thus, a hybrid layer formed using a higher deposition temperature within a certain range can be expected to have less permeability than a hybrid layer formed using a lower deposition temperature. In some cases, the hybrid layer is deposited under a deposition temperature in the range of 40° C. to 90° C.

Figure 17:
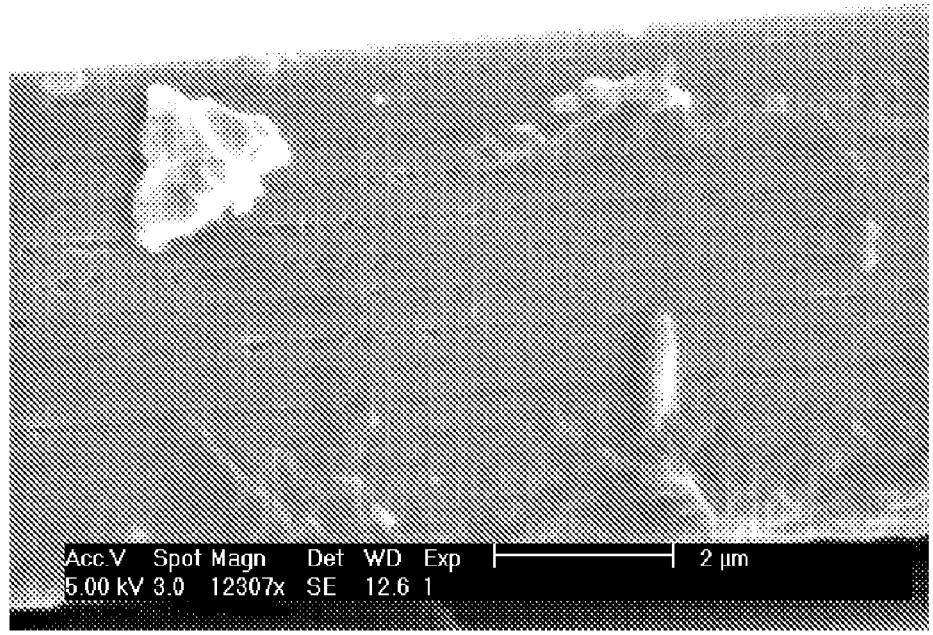
FIG. 17A shows a scanning electron micrograph of a cross-section of a hybrid layers deposited under one set conditions.
FIG. 17B shows a scanning electron micrograph of a cross-section of a hybrid layer deposited under another set conditions.
Figure 17:
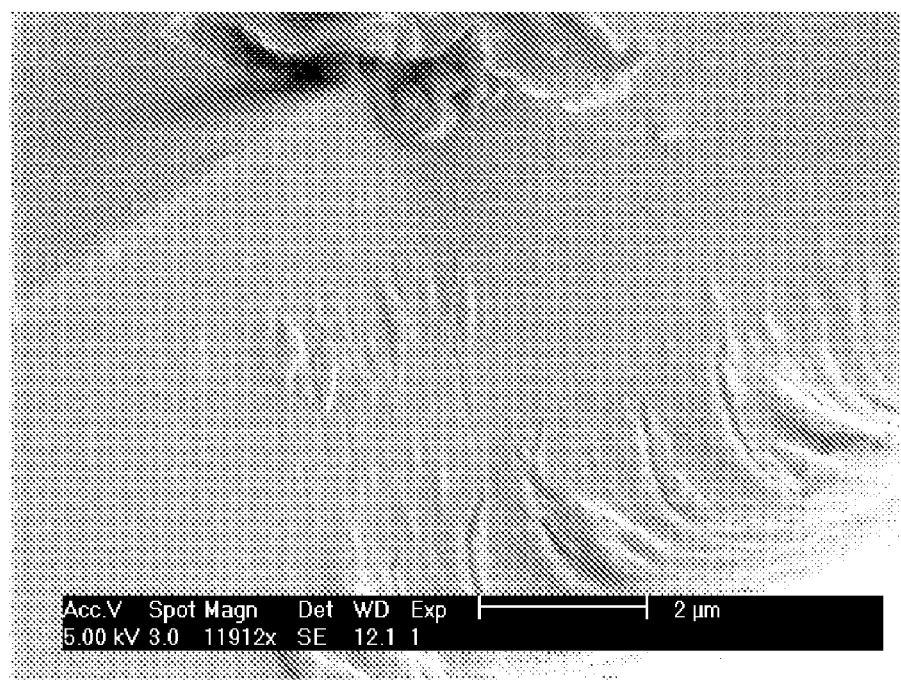

In some cases, the deposition power can be controlled to reduce the permeability of the hybrid layer. FIG. 17A shows a scanning electron micrograph (SEM) of a cross-section of a hybrid layer deposited on a bottom emitting OLED stack. The hybrid layer was deposited by PE-CVD under the following conditions:

| HMDSO gas flow rate (sccm) | $O_2$ gas flow rate (sccm) | Pressure (mTorr) | RF start power (W) | RF deposition power (W) | Total deposition time (min) | Layer thickness (μm) |
|---|---|---|---|---|---|---|
| 1.25 | 40 | variable* | 24 | 50 | 115* | 5 |

*In intermittent periods of: 9 min. at 100 mTorr, followed by 8 times 6 min. at 100 mTorr, followed by 8 min. at 130 mTorr, followed by 10 min. at 150 mTorr, followed by 9 min. at 125 mTorr, followed by 7 min. at 150 mTorr, followed by 8 min. at 125 mTorr, followed by 10 min. at 150 mTorr, followed by 8 min. at 125 mTorr, and followed by 9 min. at 125 mTorr.

Higher deposition power is believed enhance monomer fragmentation. Thus, by gradually increasing the power from 24 W to 50 W, each subsequent stratum in the hybrid layer is observed to take on a more oxide-like character and less of polymer-like character. In FIG. 17A, the stratum of the hybrid layer closest to the surface (deposited under lower power) has a porous, polymer-like microstructure, whereas the stratum farther from the surface (deposited under a higher power) has a more dense, oxide-like microstructure.

FIG. 17B shows a scanning electron micrograph (SEM) of a cross-section of another hybrid layer, which was deposited by PE-CVD on a top emitting OLED stack under the following conditions:

| HMDSO gas flow rate (sccm) | $O_2$ gas flow rate (sccm) | Pressure (mTorr) | RF start power (W) | RF deposition power (W) | Total deposition time (min) | Layer thickness (μm) |
|---|---|---|---|---|---|---|
| 1.55 | 50 | 110-150 | 55 | 60 | 135* | 6 |

*In 12 intermittent periods of 10 mins. each, with cooling between each period.

In comparison to the hybrid layer shown in FIG. 17A, a higher deposition power was used in depositing the hybrid layer shown in FIG. 17B. As a result, this hybrid layer has a microstructure that is denser than that of the hybrid layer shown in FIG. 17A. Thus, a hybrid layer formed using a higher deposition power can be expected to have less permeability than a hybrid layer formed using a lower deposition power.

When two dissimilar materials are placed in intimate contact with another, such contact may give rise to stresses, particularly at the interface between the two materials. Thus, in certain embodiments, the residual internal stress of the hybrid layer may be controlled to reduce the incidence of stress-induced defects in the hybrid layer, such as cracking, voids, buckling, or delamination. One way to control the internal stress in the hybrid layer is to adjust the deposition conditions.

Figure 18:
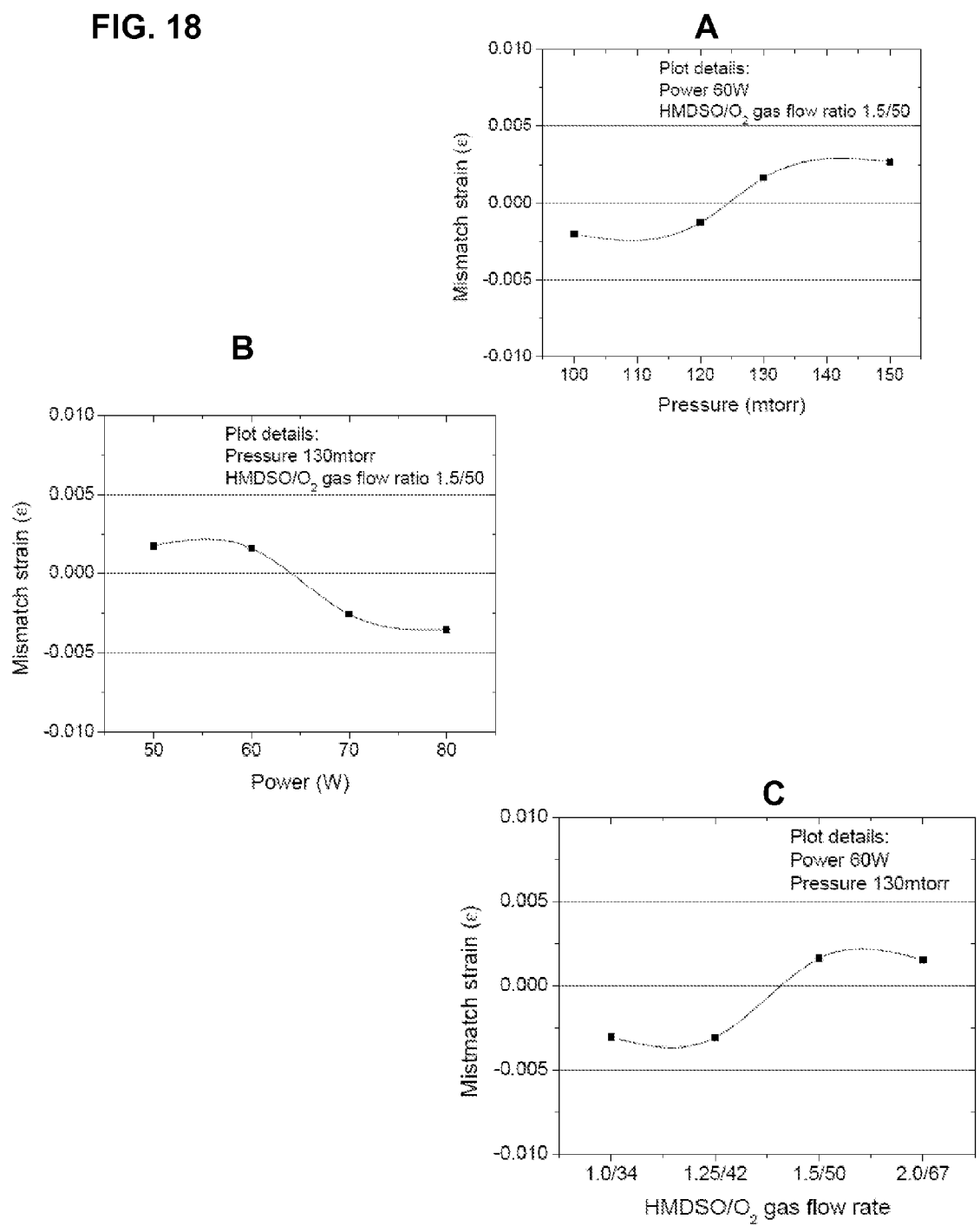
FIGS. 18A-C show plots of strain mismatches between polyimide substrates and various hybrid layers deposited thereon.

FIGS. 18A-C show the strain mismatch between 25 μm thick Kapton-E polyimide substrates and various hybrid layrs (of 320-600 nm thickness) deposited thereon under different conditions. A positive mismatch corresponds to tensile stress in the hybrid layer and a negative mismatch corresponds to compressive stress in the hybrid layer. Referring to FIG. 18A, increasing the deposition pressure from 100 mTorr to 150 mTorr, with deposition power and gas flow rate being held constant, results in greater tensile stress being created in the hybrid layer. Referring to FIG. 18B, increasing the deposition power from 50 W to 80 W, with deposition pressure and gas flow rate being held constant, results in greater compressive stress being created in the hybrid layer. Referring to FIG. 18C, increasing the HMDSO/$O_2$ gas flow rate from 1.0/34 to 2.0/67, with deposition pressure and power being held constant, results in greater tensile stress being created in the hybrid layer.

These results indicate that the internal stress in the hybrid layer can be tuned by varying the deposition parameters. These results also indicate that there is an optimum set of deposition parameters in which the stress in the hybrid layer can be minimized. For example, one deposition parameter may be tuned to create a compressive stress in the hybrid layer while another deposition parameter may be tuned to create a matching tensile stress in the hybrid layer, resulting in a residual net stress that is zero or close to zero. In instances where a multi-layered coating comprises a plurality of hybrid layers, it is also possible to individually tune the stress in each hybrid layer to control the overall stress in the coating. For example, each hybrid layer may be tuned to balance the overall stress in the coating, or to gradually increase the amount of stress in the hybrid layer with increasing distance from the surface.

In certain embodiments, where an electronic device is disposed on a surface serving as a foundation (i.e., a foundation surface), the hybrid layer and/or surface may further comprise an edge barrier to reduce the penetration of environmental contaminants (e.g., moisture or oxygen) by lateral diffusion, either through the foundation material itself or through the interface between the foundation surface and the hybrid layer. The foundation may be formed of any of the materials described herein or any other material known to be used for disposing an electronic device thereon (e.g., materials used in planarization and/or insulation layers on metal foil substrates or barrier-coated plastic substrates). Any of the various types of edge barriers as known in the art are suitable for use in the present invention. In some cases, the edge barrier is constructed by bonding the hybrid layer to the foundation surface at areas peripherally adjacent the electronic device. The bonding may be achieved by applying heat sealing or an adhesive (e.g., epoxy-based adhesives) to these areas.

In some cases, the edge barrier may be end caps that extend from a top surface of the electronic device, downwardly along the lateral sides of the electronic device, and into contact with the foundation surface. One type of end cap which may be suitable for use in the present invention is described in U.S. Pat. No. 7,002,294 (Forrest et al.). The end caps may be made of any material that can protect the electronic device from the lateral ingress of environmental contaminants, including high density ceramic materials (e.g., silicon dioxide) or metallic materials.

Figure 19:
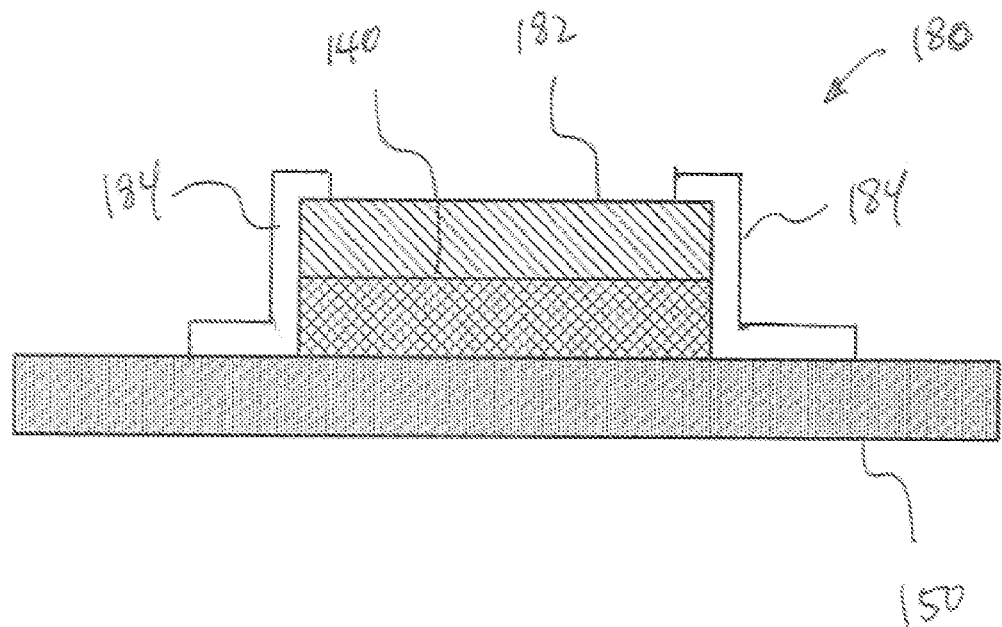
FIG. 19 shows an encapsulated OLED according to another embodiment.

For example, referring to the embodiment shown in FIG. 19, an encapsulated OLED 180 comprises a substrate 150 with the body 140 of the OLED (including the electrodes) disposed thereon. A hybrid layer 182 is deposited on OLED body 140. End caps 184 are disposed around hybrid layer 182 and OLED body 140 so as to extend from a top surface of hybrid layer 182, down the lateral aspects of OLED body 140, and into contact with the surface of substrate 150. End caps 184 function to reduce the lateral ingress of environmental contaminants through the lateral surfaces or edges of OLED 180.

In some cases, an edge barrier may be formed by creating one or more discontinuities into the foundation surface in areas peripherally adjacent the electronic device. These discontinuities can serve as a barrier against the penetration of environmental contaminants by any of various mechanisms, including increasing the path length for the lateral ingress of environmental contaminants, or where the foundation material serves as a conduit for the ingress of environmental contaminants, forming a break in the conduit. As used herein, the term "discontinuities" refers to discrete voids (e.g., trenches, grooves, slots, cracks, breaks, gaps, holes, perforations) created in the foundation surface by removal or deposition of material using techniques that control the size, shape, and location of the voids. For example, such techniques include direct-write etching using energetic beams (e.g., laser, ion, or electron), micromachining, microdrilling, lithographic processes, or masked-deposition of the foundation material with selective masking over the areas where the voids are to be created.

Figure 20:
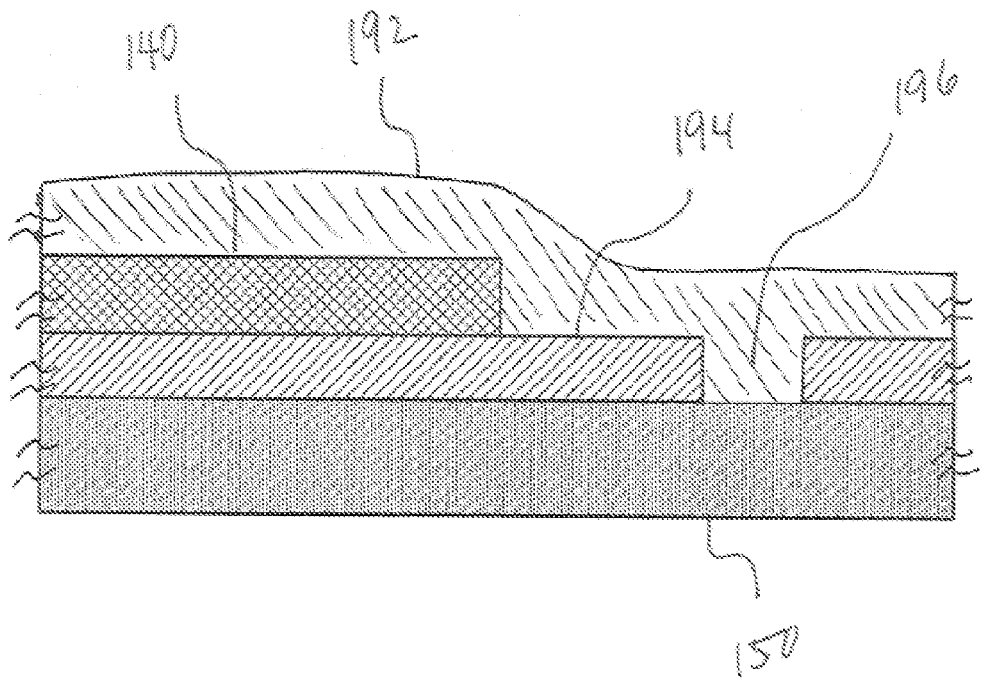
FIG. 20 shows an encapsulated OLED according to another embodiment.

For example, referring to the embodiment shown in FIG. 20, a substrate 150 is coated with a polyimide film 194. Polyimide film 194 serves as a foundation surface upon which the body 140 of an OLED (including the electrodes) is disposed. Etched into polyimide film 194 is a trench 196 that surrounds the periphery of OLED body 140. Alternatively, trench 196 may be formed by selectively masking the area during the deposition of polyimide film 194. Trench 196 extends through the full thickness of polyimide film 194. OLED body 140 is covered with a hybrid layer 192, which covers the top of OLED body 194, as well as extending down the sides of OLED body 140, to the foundation surface. On the foundation surface, hybrid layer 192 also fills-in trench 196 to prevent the polyimide film from serving as a conduit for the lateral ingress of environmental contaminants.

The foregoing description and examples have been set forth merely to illustrate the invention and are not intended to be limiting. Each of the disclosed aspects and embodiments of the present invention may be considered individually or in combination with other aspects, embodiments, and variations of the invention. Modifications of the disclosed embodiments incorporating the spirit and substance of the invention may occur to persons skilled in the art and such modifications are within the scope of the present invention.

What is claimed is:

1. A method for forming a coating over a surface, comprising:
   using a source of precursor material;
   transporting the precursor material to a reaction location adjacent a surface to be coated; and
   depositing a hybrid layer over the surface by chemical vapor deposition using the source of precursor material, wherein the hybrid layer consists essentially of a mixture of polymeric silicon and inorganic silicon, wherein the weight ratio of polymeric silicon to inorganic silicon is in the range of 95:5 to 5:95, and wherein the polymeric silicon and the inorganic silicon are created from the same source of precursor material;
   wherein at least an 0.1 μm thickness of the hybrid layer is deposited under the same reaction conditions for all the reaction conditions in the deposition process;
   wherein the water vapor transmission rate is less than $10^{-6}$ g/m$^2$/day through the at least 0.1 μm thickness of the hybrid layer.

2. The method of claim 1, wherein the precursor material is hexamethyl disiloxane or dimethyl siloxane.

3. The method of claim 1, wherein the precursor material comprises a single organo-silicon compound.

4. The method of claim 1, wherein the precursor material comprises a mixture of organo-silicon compounds.

5. The method of claim 1, wherein the chemical vapor deposition is plasma-enhanced.

6. The method of claim 5, further comprising providing a reactant gas and wherein the chemical vapor deposition takes place in the presence of the reactant gas.

7. The method of claim 6, wherein the reactant gas is oxygen.

8. The method of claim 1, wherein the weight ratio of polymeric silicon to inorganic silicon is in the range of 90:10 to 10:90.

9. The method of claim 1, wherein the weight ratio of polymeric silicon to inorganic silicon is in the range of 25:75 to 10:90.

10. The method of claim 1, wherein at least a 1,600 Å thickness of the hybrid layer is deposited under the same reaction conditions for all the reaction conditions in the deposition process.

11. The method of claim 1, wherein a 1,600-60,000 Å thickness of the hybrid layer is deposited under the same reaction conditions for all the reaction conditions in the deposition process.

12. The method of claim 1, wherein the precursor material is hexamethyl disiloxane or dimethyl siloxane; and wherein the chemical vapor deposition is plasma-enhanced.

13. The method of claim 1, further comprising depositing an unmixed polymeric silicon layer over the surface using the source of precursor material prior to depositing the hybrid layer.

14. The method of claim 1, further comprising depositing an unmixed inorganic silicon layer over the surface using the source of precursor material prior to depositing the hybrid layer.

15. The method of claim 1, further comprising depositing an unmixed polymeric silicon layer over the surface using the source of precursor material after depositing the hybrid layer.

16. The method of claim 1, further comprising depositing an unmixed inorganic silicon layer over the surface using the source of precursor material after depositing the hybrid layer.

17. The method of claim 1, wherein the hybrid layer, as deposited, has a wetting contact angle of a water droplet in the range of 36° to 60°.

18. The method of claim 1, wherein the hybrid layer is optically transparent.

19. The method of claim 18, wherein the hybrid layer has greater than 90% transmittance from the near-UV to the near-IR spectrum.

20. The method of claim 1, wherein the surface is pretreated prior to depositing the hybrid layer to improve the interfacial cohesion between the surface and the hybrid layer.

21. The method of claim 20, wherein the step of pretreating the surface comprises a chemical treatment.

22. The method of claim 20, wherein the step of pretreating the surface comprises a physical-chemical treatment.

23. The method of claim 22, wherein the physical-chemical treatment is a plasma treatment.

24. The method of claim 20, wherein the step of pretreating comprises disposing an intervening layer on the surface prior to depositing the hybrid layer.

25. The method of claim 24, wherein the intervening layer comprises a material that serves to increase the interfacial cohesion between the surface and the hybrid layer.

26. The method of claim 1, wherein the thickness of the hybrid layer deposited under the same reaction conditions is in a range from 0.1-10 µm.

27. The method of claim 1, further comprising:
depositing a plurality of hybrid layers over the surface by chemical vapor deposition using the source of precursor material, wherein each hybrid layer independently consists essentially of a mixture of polymeric silicon and inorganic silicon, wherein the weight ratio of polymeric silicon to inorganic silicon is in the range of 95:5 to 5:95, and wherein the polymeric silicon and the inorganic silicon are created from the same source of precursor material;
wherein for each of the plurality of hybrid layers, at least an 0.1 µm thickness of the hybrid layer is deposited under the same reaction conditions for all the reaction conditions in the deposition process.

28. The method of claim 27, wherein the plurality of hybrid layers are created by sequentially changing one or more of the reaction conditions in the chemical vapor deposition process.

29. The method of claim 28, further comprising providing a reactant gas, wherein the chemical vapor deposition takes place in the presence of the reactant gas, and wherein the plurality of hybrid layers are created by sequentially changing the amount of reactant gas in the chemical vapor deposition process.

30. The method of claim 27, wherein the amount of polymeric silicon in one hybrid layer differs by at least 10 weight % from the amount of polymeric silicon in another hybrid layer.

31. The method of claim 28, wherein the chemical vapor deposition is plasma-enhanced, and wherein the plurality of hybrid layers are created by sequentially changing the plasma power level in the plasma-enhanced chemical vapor deposition process.

32. The method of claim 27, wherein the overall internal stress in the multi-layered coating is controlled by tuning the internal stress in each hybrid layer.

33. The method of claim 32, wherein the internal stress in each hybrid layer is tuned by controlling the deposition conditions used to deposit each hybrid layer.

34. The method of claim 33, wherein the internal stress in each of the hybrid layers is tuned by controlling at least two deposition conditions which have an effect on the internal stress.

35. The method of claim 33, wherein each hybrid layer is deposited by plasma-enhanced chemical vapor deposition (PE-CVD), and wherein the deposition conditions being controlled are selected from the group consisting of: deposition pressure, deposition power, gas flow rates, and electrode distance.

36. The method of claim 32, wherein the internal stress in each hybrid layer is tuned such that the overall internal stress in the multi-layered coating is balanced.

37. The method of claim 36, wherein the overall internal stress in the multi-layered coating is zero or nearly zero.

38. The method of claim 32, wherein at least one hybrid layer closer to the surface has a lower internal stress than at least one hybrid layer farther from the surface.

39. The method of claim 24, wherein the intervening layer is optically transparent.

40. The method of claim 24, wherein the intervening layer comprises an inorganic material.

41. The method of claim 40, wherein the inorganic material is chromium or silicon nitride.

42. The method of claim 27, wherein the precursor material is hexamethyl disiloxane or dimethyl siloxane; and wherein the chemical vapor deposition is plasma-enhanced.

43. The method of claim 27, wherein for each of the plurality of hybrid layers, the thickness of the hybrid layer deposited under the same reaction conditions is in a range from 0.1-10 µm.

* * * * *